United States Patent
Chang et al.

(10) Patent No.: US 6,492,248 B2
(45) Date of Patent: Dec. 10, 2002

(54) FEW-PARTICLE-INDUCED LOW-PRESSURE TEOS PROCESS

(75) Inventors: Jen Chieh Chang, Taipei (TW); Yi Fu Chung, Taoyuan (TW); Ching-Cheng Hsieh, Taoyuan (TW); Pei-Feng Sun, Kaohsiung (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/888,398

(22) Filed: Jun. 26, 2001

(65) Prior Publication Data

US 2002/0058398 A1 May 16, 2002

(30) Foreign Application Priority Data

Nov. 10, 2000 (CN) .......................................... 089123890

(51) Int. Cl.[7] .............................................. H01L 21/20
(52) U.S. Cl. ...................... 438/484; 438/382; 438/624; 438/631; 438/789
(58) Field of Search ................. 438/484, 624, 438/631, 789, 382

(56) References Cited

U.S. PATENT DOCUMENTS

| | | | | |
|---|---|---|---|---|
| 4,872,947 A | * | 10/1989 | Wang et al. | 156/643 |
| 5,869,394 A | * | 2/1999 | Chen et al. | 438/624 |
| 6,040,227 A | * | 3/2000 | Wuu et al. | 438/382 |
| 6,284,662 B1 | * | 9/2001 | Mikagi | 438/706 |
| 6,296,710 B1 | * | 10/2001 | Allen et al. | 118/715 |

* cited by examiner

*Primary Examiner*—Richard Elms
*Assistant Examiner*—Pho M. Luu
(74) *Attorney, Agent, or Firm*—Bacon & Thomas

(57) ABSTRACT

A few-particle-induced low-pressure TEOS process is disclosed. First, a lot of semiconductor substrates are arranged on a boat and transferred into a TEOS reactor. Silicon oxide films are then deposited on the semiconductor substrates by performing a low-pressure TEOS process. Before the substrates are sent out of the reactor, an annealing process is performed by injecting oxygen gas into the reactor to solidify the oxide films on the corners of the boat's flanges.

14 Claims, 6 Drawing Sheets

FEW-PARTICLE-INDUCED LOW-PRESSURE TEOS PROCESS

FIELD OF THE INVENTION

The present invention relates to a low-pressure TEOS process, more specifically, to a low-pressure TEOS process inducing few particles.

BACKGROUND OF THE INVENTION

Dielectric materials, such as oxide, nitride, oxynitride, phosphosilicate glass (PSG) and borophosphosilicate glass (BPSG), play a significant role in the field of semiconductor industry. All of the dielectric materials contain silicon and are generally deposited by performing atmospheric chemical vapor deposition (APCVD), low pressure chemical vapor deposition (LPCVD), or plasma enhanced chemical vapor deposition (PECVD). There are two kinds of reactive gases for forming a dielectric film containing silicon in semiconductor industry, e.g. silane-based (silane) gases and TEOS-based (Tetra-Ethyl-Ortho-Silicate) gases.

TEOS is an organic silicate containing silicon and oxygen, and it is in liquid phase under room temperature and atmospheric pressure. During a deposition process, the TEOS liquid is heated to a temperature between 40 to 70° C. in order to increase its saturation vapor pressure. In the meanwhile, the semiconductor substrate needs to be heated to a temperature between 700 to 750° C. under low pressure (about 0.5 torr). The low-pressure TEOS process is widely applied in the semiconductor industry because of its good step coverage, such as the process for forming dielectric sidewall spacer.

The low-pressure TEOS process is generally performed in a reactor of tubular type. The reactor is composed of annealed quartz, containing a heater surrounding its outer sidewall for heating. During a deposition process, a lot of semiconductor substrates standing side by side in a boat are transferred into the reactor. Please refer first to FIG. 1, which shows a schematic diagram of a boat. The boat 20 has lots of flanges 30 in its internal sidewall, each of which can carry one semiconductor substrate 10. After the deposition process is accomplished, the substrates are transferred out of the reactor together with the boat.

However, according to the prior art, a plenty of particles 40 are generally produced on the semiconductor substrate 10 around the regions in contact with the corners of the flange after the deposition process, as shown in FIG. 2. From EDS (Energy Dispersive Spectroscopy) data, the particles 40 are affirmed to be composed of silicon oxide. For this reason, we can conclude that the particle contamination results from the low-pressure TEOS process. During the deposition process, the silicon oxide films are deposited not only on the semiconductor substrates, but also on the flanges of the boat. Because the corners of the flanges have much larger geometric curvature, the oxide films deposited on the corners of the flanges have larger stress, which results in poorer adhesion. The poor adhesion will frequently induce particles falling on the surface of the substrates.

According to the prior art, the boat should be changed and cleaned after a several of runs to prevent particle contamination. Therefore, not only the production throughput decreases, but also the loading of maintenance engineers largely increases in accordance with the prior art.

SUMMARY OF THE INVENTION

Accordingly, it is a primary object of the present invention to provide a few-particle-induced low-pressure TEOS process.

It is another object of the present invention to provide a method of enhancing the throughput of a low-pressure TEOS process.

A few-particle-induced low-pressure TEOS process is disclosed. First, a lot of semiconductor substrates are arranged on a boat and transferred into a TEOS reactor. Silicon oxide films are then deposited on the semiconductor substrates by performing a conventional low-pressure TEOS process. Before the substrates are sent out of the reactor, an annealing process is performed by injecting oxygen gas into the reactor to solidify the oxide films on the corners of the boat's flanges. The annealing process is performed under a pressure between 0.3 torr to 0.7 torr for a duration between 10 minutes to 50 minutes, and the substrates keep being heated to a temperature between 700 to 750° C. during the annealing process.

Another few-particle-induced low-pressure TEOS process is disclosed in another embodiment. First, a lot of semiconductor substrates are arranged on a boat and transferred into a TEOS reactor. Silicon oxide films are then deposited on the semiconductor substrates by performing a conventional low-pressure TEOS process. Before the substrates are sent out of the reactor, an annealing process is performed by injecting oxygen gas into the reactor to solidify the oxide films on the corners of the boat's flanges. After sending the boat out of said reactor, a next lot of semiconductor substrates are arranged on the boat and then transferred into the TEOS reactor. Thereafter, the steps mentioned above are repeated for 5 to 15 times to accomplish the low-pressure TEOS process for 5 to 15 lots of semiconductor substrates. After that, the boat is sent into the reactor without carrying semiconductor substrates. Finally, a strengthening annealing process is performed by injecting oxygen gas into the reactor to solidify the oxide films on the corners of the boat's flanges.

PREFERRED EMBODIMENTS

The present invention relates to a low-pressure TEOS process, more specifically, to a low-pressure TEOS process inducing few particles.

Figure 1:
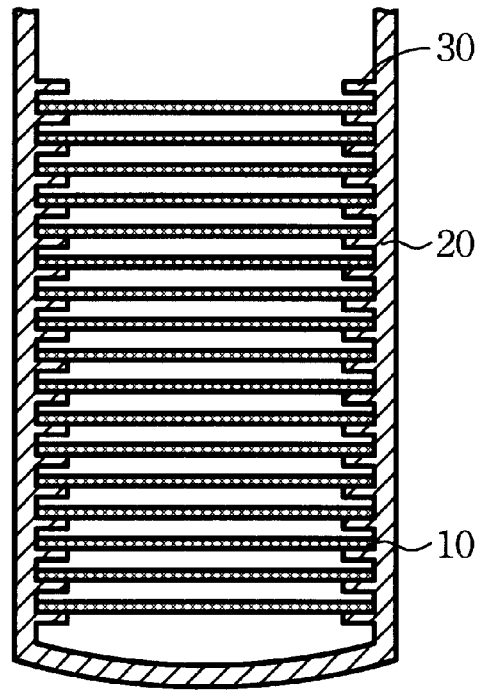
FIG. 1 shows a schematic diagram of a boat.
Figure 2:
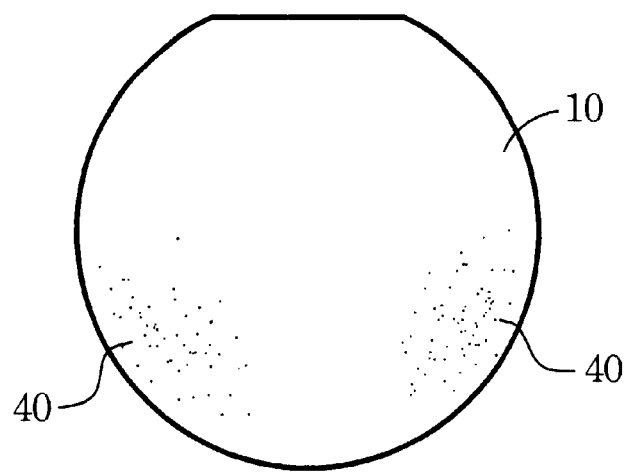
FIG. 2 shows the flow chart of the low-pressure TEOS process according to the prior art.
Figure 3:
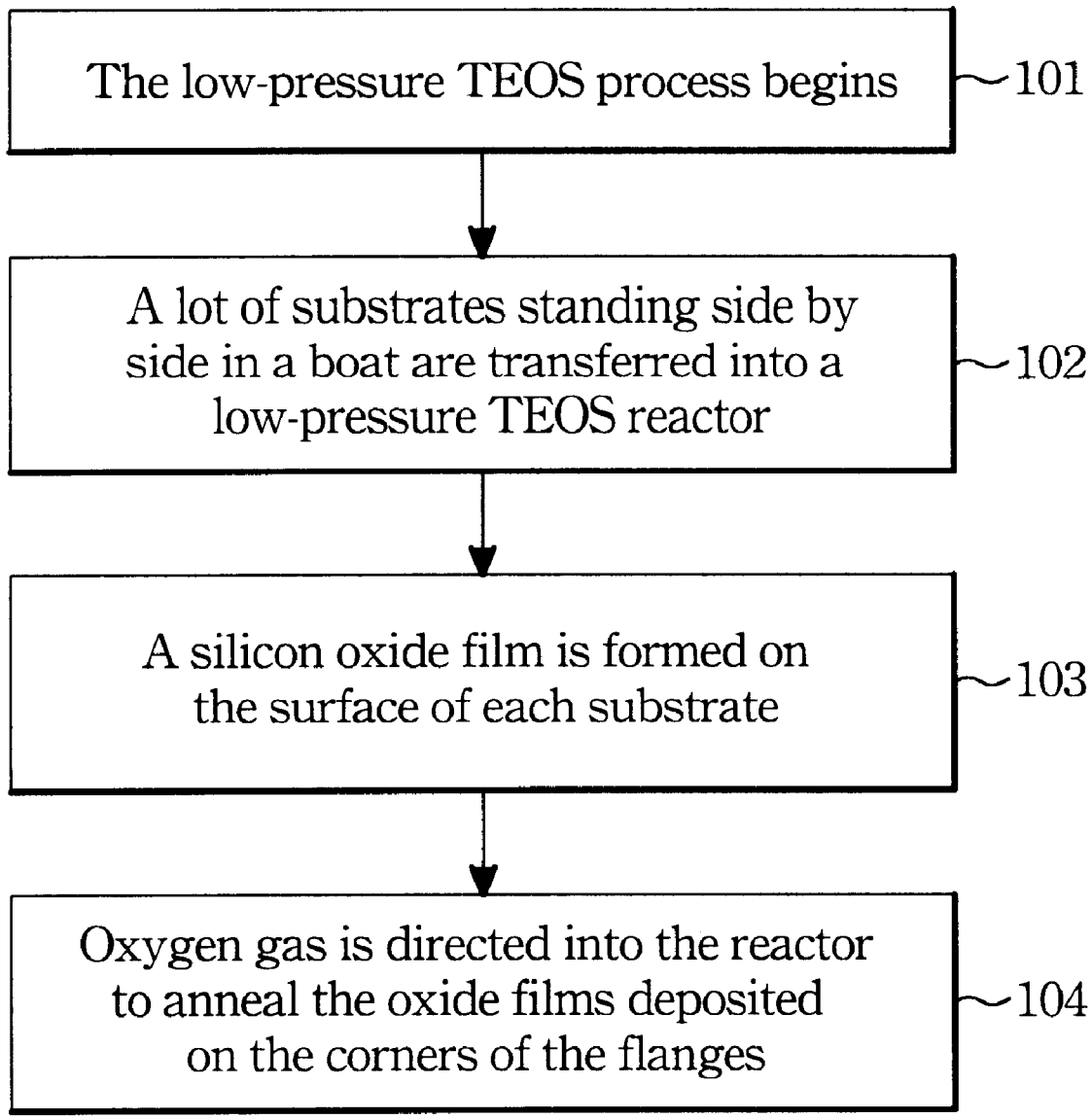
FIG. 3 shows the flow chart of the few-particle-induced low-pressure TEOS process according to the first embodiment of the present invention.

Referring now to FIG. 3, the flow chart of the few-particle-induced low-pressure TEOS process according to the first embodiment of the present invention is shown. After the low-pressure TEOS process begins (step 101), a lot of semiconductor substrates standing side by side in a boat are transferred into a low-pressure TEOS reactor (step 102). Next, a silicon oxide film is formed on the surface of each semiconductor substrate by performing the conventional low-pressure TEOS process (step 103). The low-pressure TEOS process is performed in the reactor under a pressure of between 0.1 torr to 1.0 torr. During the process, the TEOS liquid is heated to a temperature between 40° C. to 70° C., and the semiconductor substrates are heated to a temperature between 700 ° C. to 750° C. As shown in the Background of the Invention, the silicon oxide films are deposited not only on the surfaces of the substrates, but also on the boat. Because the corners of the flanges have much larger geometric curvature, the oxide films deposited on the corners of the flanges have larger stress, which results in poorer attachment. The poor adhesion will frequently induce oxide particles falling on the surfaces of the substrates.

The key feature of the present invention is to overcome the drawback. Instead of transferring the substrates out of the reactor directly after the deposition process, oxygen gas is directed into the reactor after the deposition process to anneal the silicon oxide films deposited on the corners of the flanges (step 104). The annealing process is performed under a pressure between 0.3 torr to 0.7 torr for a duration between 10 minutes to 50 minutes, and the substrates keep being heated to a temperature between 700 to 750° C. during the annealing process.

Figure 5A:
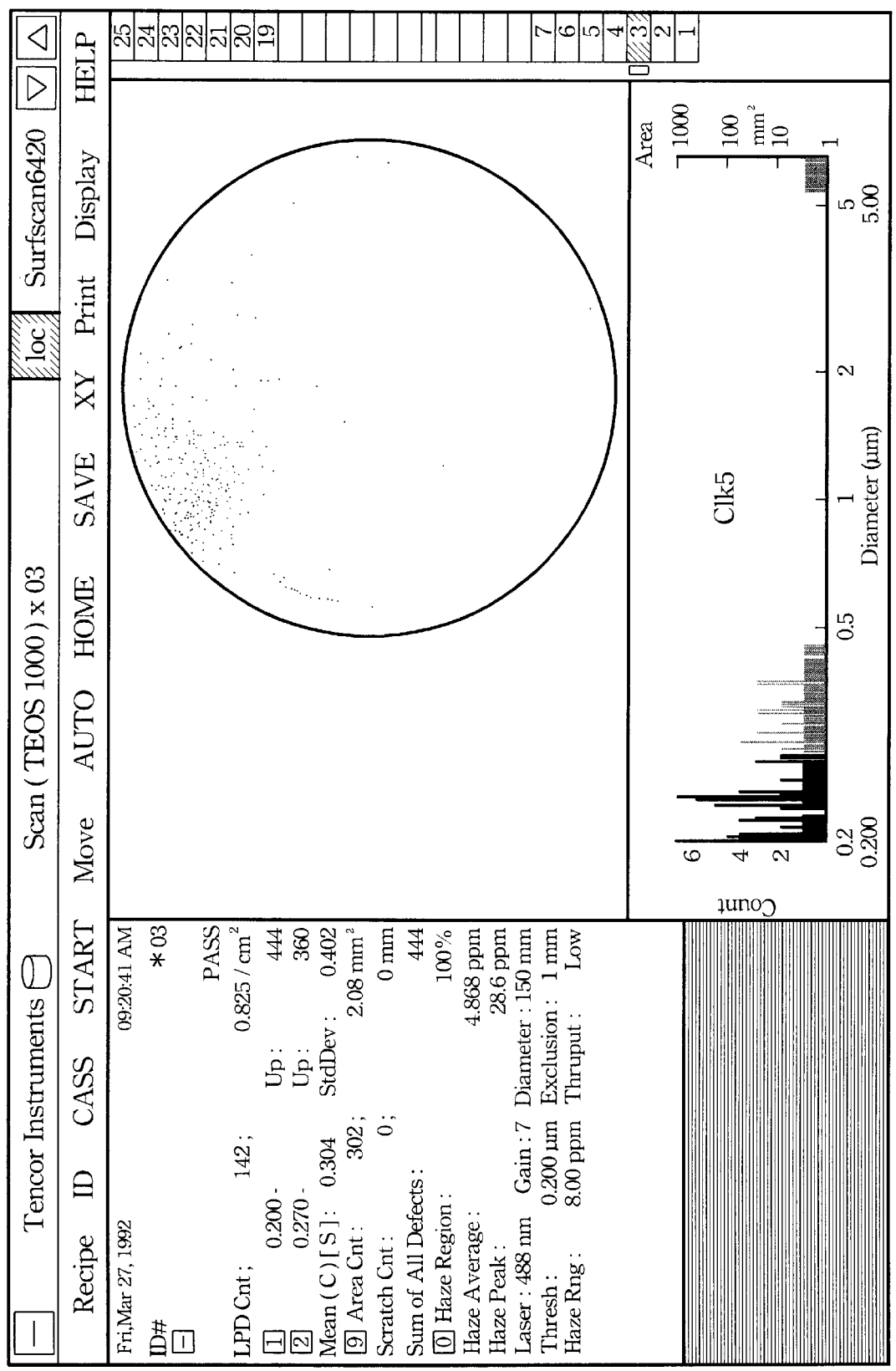
FIG. 5A shows a particle distribution diagrams induced by the low-pressure TEOS process according to the prior art.
Figure 5B:
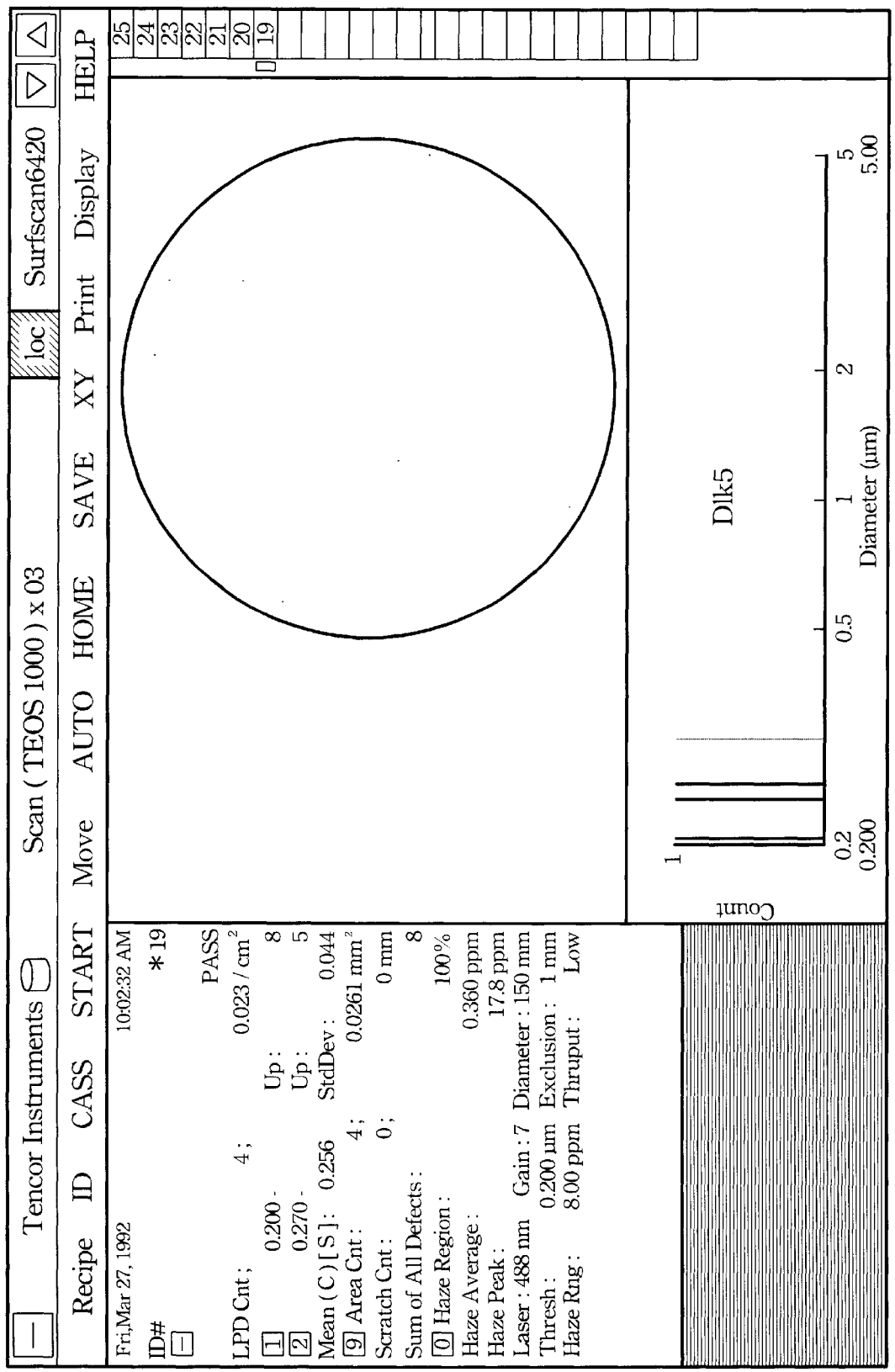
FIG. 5B shows the particle distribution diagrams induced by low-pressure TEOS process according to the present invention.

The main purpose of the annealing process is to reduce the stress of the silicon oxide films deposited on the corners of the flanges, in order to enhance the adhesion force between the oxide films and the flanges. For this reason, the oxide-induced particle contamination (especially around the corners of the flanges) in the prior art can be largely decreased. Furthermore, the maintenance frequency of the TEOS reactor can be substantially abated because of the decrease of particle contamination. Therefore, decreasing the particle contamination can not only enhance the manufacture yield, but also promote the throughput of the TEOS reactor. Referring first to FIG. 5A, a particle distribution diagrams induced by low-pressure TEOS process according to the prior art is shown. Lots of particles are detected by a particle scanner (such as KLA or TENCOR) around the regions in contact with the corner of the flange. On the other hand, FIG. 5B shows the particle distribution diagrams induced by low-pressure TEOS process according to the present invention. The difference between FIG. 5A and FIG. 5B demonstrates the improvement of the present invention.

Figure 6:
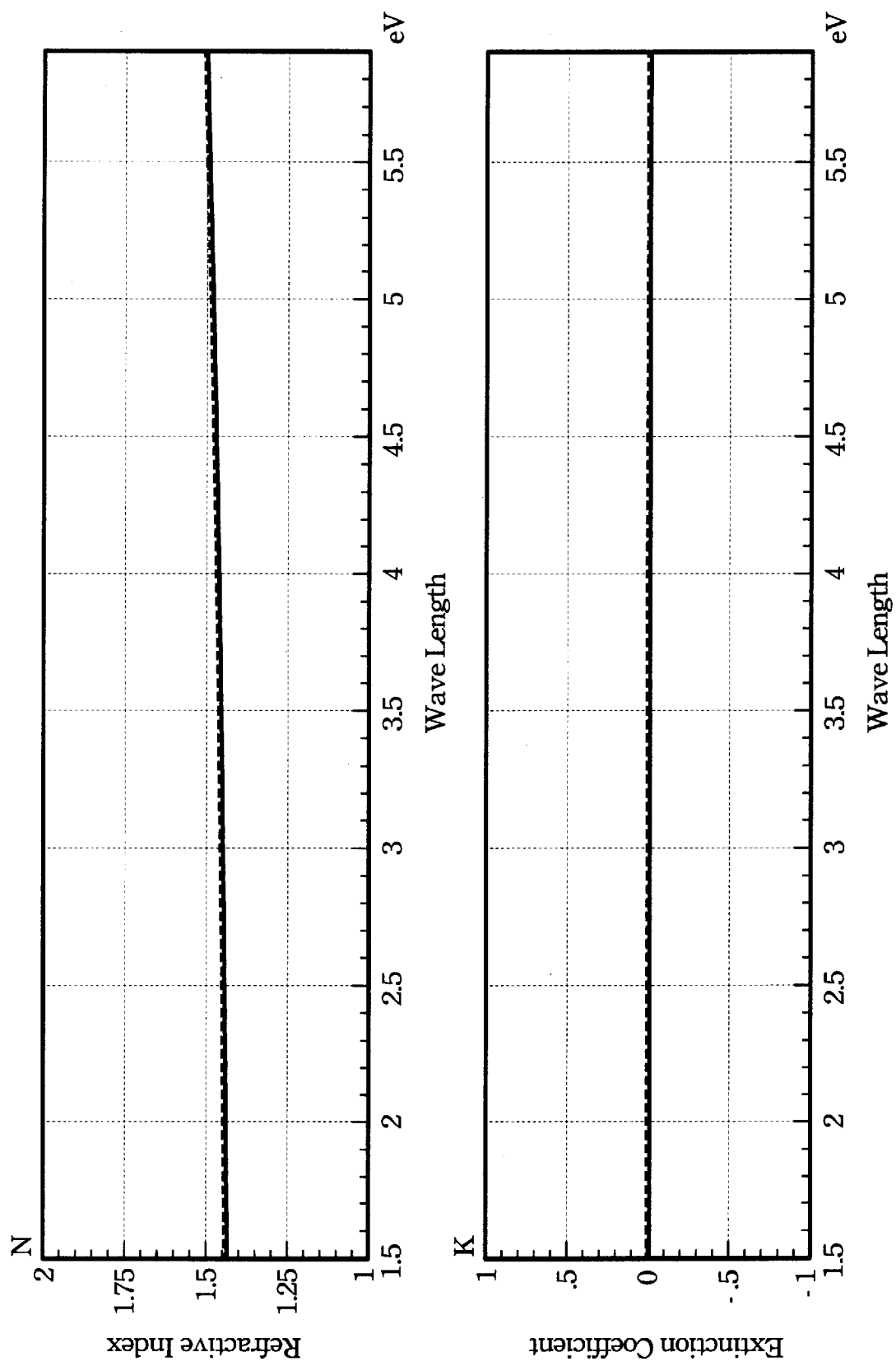
FIG. 6 shows the n&k diagrams of the silicon oxide film on the substrate detected by an ellipsometer, wherein the dotted lines and the real line represent the n&k values according to the prior art and the present invention, respectively.

It should be noted that the annealing process could use only oxygen gas as reaction gas, because the oxygen gas is the only one gas wouldn't alter the ingredients of the silicon oxide film deposited on the surfaces of the semiconductor substrates. FIG. 6 shows the n&k diagrams of the silicon oxide film on the substrate detected by an ellipsometer, wherein the dotted lines and the real line represent the n&k values according to the prior art and the present invention, respectively. FIG. 6 proves that the annealing process of the present invention doesn't change the composition of the silicon oxide film deposited on the surfaces of the substrates.

Figure 4:
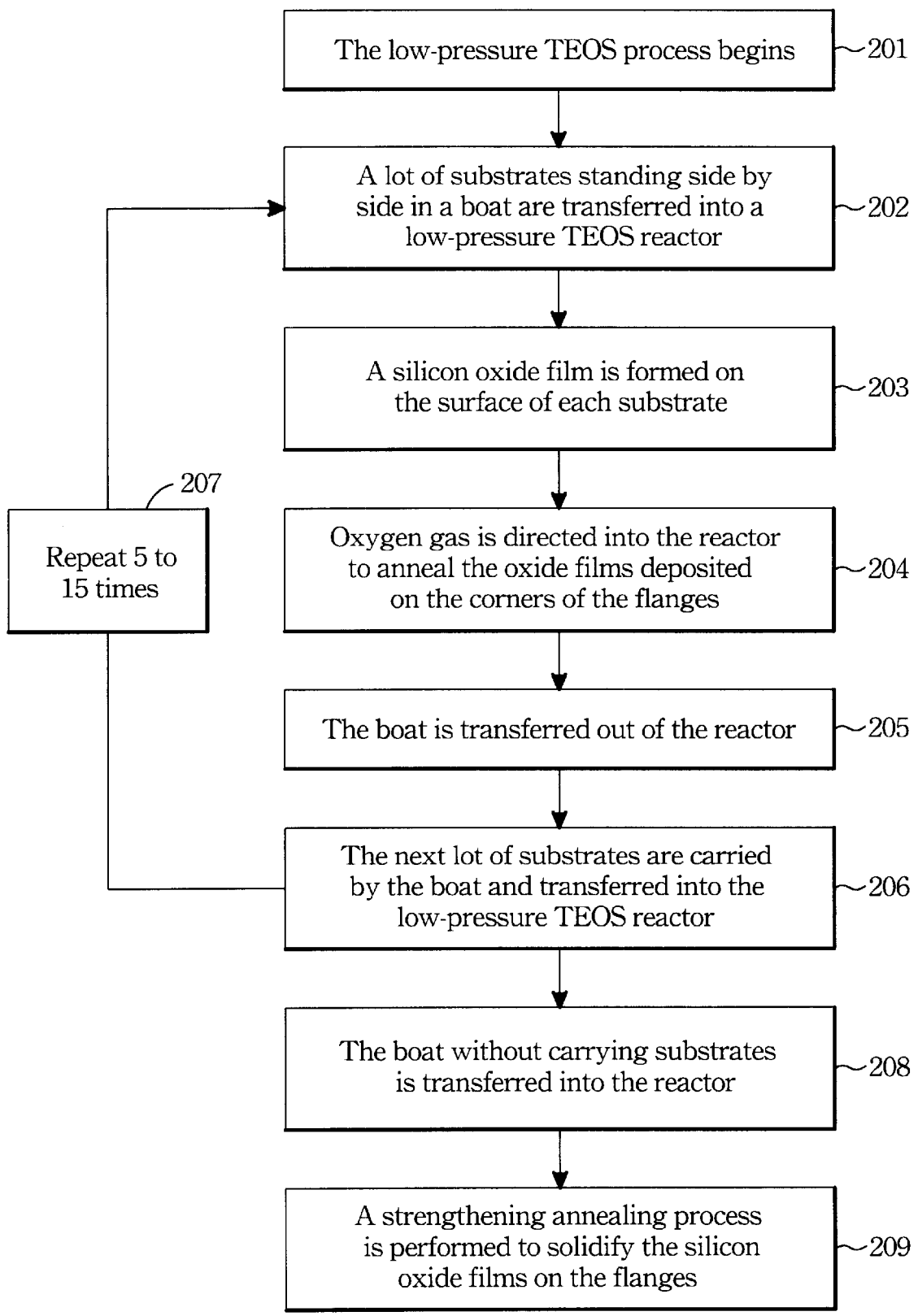
FIG. 4 shows the flow chart of the few-particle-induced low-pressure TEOS process according to the second embodiment of the present invention.

Referring now to FIG. 4, the flow chart of the few-particle-induced low-pressure TEOS process according to the second embodiment of the present invention is shown. After the low-pressure TEOS process begins (step 201), a lot of semiconductor substrates standing side by side in a boat are transferred into a low-pressure TEOS reactor (step 202). Next, a silicon oxide film is formed on the surface of each semiconductor substrate by performing the conventional low-pressure TEOS process (step 103). The low-pressure TEOS process is performed in the reactor under a pressure of between 0.1 torr to 1.0 torr. During the process, the TEOS liquid is heated to a temperature between 40° C. to 70° C., and the semiconductor substrates are heated to a temperature between 700° C. to 750° C.

Thereafter, instead of transferring the substrates out of the reactor directly after the deposition process, oxygen gas is directed into the reactor after the deposition process to anneal the silicon oxide films deposited on the corners of the flanges (step 204). The annealing process is performed under a pressure between 0.3 torr to 0.7 torr for a duration between 10 minutes to 50 minutes, and the substrates keep being heated to a temperature between 700 to 750° C. during the annealing process. After the annealing process, the boat containing substrates is transferred out of the reactor (step 205), and the low-pressure TEOS process for the lot of substrates finishes. After that, the next lot of semiconductor substrates are carried by the boat and then transferred into the low-pressure TEOS reactor (step 206). Thereafter, the processes between step 202 to step 206 are repeated 5 times to 15 times to accomplish oxide deposition for 5 to 15 lots of substrates (step 207). Next, the boat without carrying substrates is then transferred into the low-pressure TEOS reactor (step 208), and a strengthening annealing process is performed by injecting oxygen gas to intensify the silicon oxide films on the flanges (step 209). The annealing process is performed under a pressure between 0.1 torr to 1.0 torr for a duration between 10 minutes to 60 minutes, and the substrates keep being heated to a temperature between 700 to 750° C. during the annealing process. According to this embodiment, the silicon oxide films on the boat (especially on the corners of the flanges) can be further strengthened. In the meanwhile, the adhesion of the silicon oxide films can be further improved. For this reason, the particle contamination induced by the low-pressure TEOS process can be significantly decreased. Therefore, the production yield can be largely enhanced.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What we claimed is:

1. A few-particle-induced low-pressure TEOS process, said process comprising:

a. arranging a lot of semiconductor substrates on a boat;

b. transferring said boat into a TEOS reactor;

c. depositing silicon oxide films on said semiconductor substrates by performing a low-pressure TEOS process; and d. performing an annealing process by injecting oxygen gas into said reactor to solidify silicon oxide films deposited on said boat.

2. The method of claim 1, said oxygen gas contains oxygen molecules ($O_2$).

3. The method of claim 1, wherein said annealing process is performed to heat said semiconductor substrates to a temperature between 700° C. to 750° C.

4. The method of claim 1, wherein said annealing process is performed under a pressure between 0.3 torr to 0.7 torr.

5. The method of claim 1, wherein said annealing process is performed for a duration between 10 minutes to 50 minutes.

6. A few-particle-induced low-pressure TEOS process, said process comprising:

a. arranging a lot of semiconductor substrates on a boat and then transferring said boat into a TEOS reactor;

b. depositing silicon oxide films on said semiconductor substrates by performing a low-pressure TEOS process;

c. performing an annealing process by injecting oxygen gas into said reactor to solidify silicon oxide films deposited on said boat;

d. transferring said boat out of said reactor;

e. arranging a next lot of semiconductor substrates on said boat and then transferring said boat into said TEOS reactor;

f. repeating said step b to step e for a predetermined times to accomplish said low-pressure TEOS process for said predetermined lots of semiconductor substrates;

g. transferring said boat without carrying semiconductor substrates into said reactor; and h. performing a strengthening annealing process by injecting oxygen gas into said reactor.

7. The method of claim 6, wherein said predetermined times are between 5 times to 15 times.

8. The method of claim 6, said oxygen gas contains oxygen molecules ($O_2$).

9. The method of claim 6, wherein said annealing process is performed to heat said semiconductor substrates to a temperature between 700° C. to 750° C.

10. The method of claim 6, wherein said annealing process is performed under a pressure between 0.3 torr to 0.7 torr.

11. The method of claim 6, wherein said annealing process is performed for a duration between 10 minutes to 50 minutes.

12. The method of claim 6, wherein said strengthening annealing process is performed to heat said semiconductor substrates to a temperature between 700° C. to 750° C.

13. The method of claim 6, wherein said strengthening annealing process is performed under a pressure between 0.1 torr to 1.0 torr.

14. The method of claim 6, wherein said strengthening annealing process is performed for a duration between 10 to 60 minutes.

* * * * *